United States Patent [19]

Sato

[11] Patent Number: 5,330,926
[45] Date of Patent: Jul. 19, 1994

[54] METHOD OF FABRICATING SEMICONDUCTOR DEVICE HAVING A TRENCHED CELL CAPACITOR

[75] Inventor: Natsuki Sato, Tokyo, Japan

[73] Assignee: NEC Corporation, Tokyo, Japan

[21] Appl. No.: 791,345

[22] Filed: Nov. 14, 1991

[30] Foreign Application Priority Data

Nov. 14, 1990 [JP] Japan .................. 2-307688

[51] Int. Cl.$^5$ .................. H01L 21/70; H01L 27/00
[52] U.S. Cl. .................. 437/52; 437/47; 437/919
[58] Field of Search .................. 437/36, 52, 51, 47, 437/60, 919; 357/23.6; 365/185

[56] References Cited

U.S. PATENT DOCUMENTS 4,676,847  6/1987  Lin ..................... 437/919

FOREIGN PATENT DOCUMENTS 0201706  11/1986  European Pat. Off. ........ 357/23.6 G
55-75235   6/1980  Japan ..................... 437/36
62-94977   5/1987  Japan ..................... 437/52
63-119239  5/1988  Japan ..................... 437/52

*Primary Examiner*—Robert Kunemund
*Assistant Examiner*—H. Jey Tsai
*Attorney, Agent, or Firm*—Burns, Doane, Swecker & Mathis

[57] ABSTRACT

A method for fabricating a semiconductor device, adapted for a MOS type DRAM having a grooved cell capacitor portion formed on a main surface of a semiconductor substrate, including the steps of: forming a highly concentrated first layer of the same conductivity type as that of a semiconductor substrate on a desired portion with an oxidization-resistant first insulating film as a mask, and performing thermal oxidization to form a field oxidized film; removing the first insulating film; forming a second insulating film; forming an opening on the second insulating film at the portion which is in a close proximity to the field oxidized film; etching the semiconductor substrate to form a groove; performing oblique rotational ion injection into a portion other than an upper side wall of the groove with the second insulating film as a peak-shaped mask, forming only on a desired region a highly concentrated second layer of the same conductivity type as that of the semiconductor substrate; removing the second insulating film, forming a highly concentrated third layer of an opposite conductivity type to that of the semiconductor substrate at least on the entire side wall of the groove; and forming a high dielectric film and a conductive electrode in the groove.

21 Claims, 3 Drawing Sheets

METHOD OF FABRICATING SEMICONDUCTOR DEVICE HAVING A TRENCHED CELL CAPACITOR

BACKGROUND OF THE INVENTION

1. Field of the Invention

The present invention relates to a method for fabricating a semiconductor device, and more particularly, to an ion injecting method for injecting ions into the side wall of a grooved capacitor in a MOS type DRAM having a grooved cell capacitor portion having a memory capacitor formed in the portion of a groove provided on the substrate of a semiconductor memory device.

2. Description of the Related Art

Many semiconductor memory devices are configured to have 1-transistor and 1-capacitor memory cells each consisting of a single MOS transistor and a single capacitor coupled in series to the transistor. A typical conventional method for fabricating semiconductor memory devices of this type will now be described referring to FIGS. 1 through 4. In this example, a semiconductor substrate 1 is of a p-type silicon substrate.

To begin with, as shown in FIG. 1, after a nitrided film 2 is formed on the semiconductor substrate 1, a lithography step will be carried out to form an opening that reaches the substrate, and then $B^+$ ions will be injected through the opening in the desired portion for a device isolating region to prevent a punch through between devices, thereby forming a $p^+$ layer 3. Next, as shown in FIG. 2, the semiconductor substrate 1 is oxidized using a LOCOS method to form a field oxidized film 4 that will be the device isolating region and the nitrided film 2 is then eliminated. Subsequently, $As^+$ ions are injected into the desired portion through a lithography step to form an $n^+$ layer 5 with a concentration of $10^{18}$ cm$^{-3}$ and a depth of 0.3 $\mu$m. Then, as shown in FIG. 3, a photoresist 6 is applied on the resultant structure, a lithography step is performed to form an opening that reaches the $n^+$ layer 5 in the desired portion, and the semiconductor substrate 1 is etched around the opening, forming a groove 7 to form a capacitor. Then $B^+$ ions are injected in the side wall of the groove 7 through oblique rotational injection to increase the capacitor and reduce soft error, thus forming a $p^+$ layer 8. At this time, the ions are injected while changing an oblique ion injecting angle $\theta$ within a range of 0 (vertical) to 55 degrees so that the boron concentration in the groove 7 may be uniform. This method however provides a $p^+$ layer-overlapped portion 21 where the $p^+$ layer 3 underlying the field oxidized film 4 overlaps with the $p^+$ layer 8 of the side wall of the groove's opening, and increases the boron concentration for such portion accordingly. It is therefore possible that a depression layer of a p-n junction to be formed later becomes thinner locally by the $p^+$ layer-overlapped portion 21. As a result, an electric field may concentrate on this portion, increasing the leak current and reducing the dielectric strength. Further, crystal defects which occur in the silicon substrate when ions are injected are likely to remain, which may also increase the leak current. In other words, the charge accumulation time of the grooved capacitor will be significantly longer, preventing the semiconductor device from functioning as a DRAM. In short the prior art technique merely accomplishes the ion injection in the upper portion of the groove's side wall or ion injection in the entire groove, but cannot inject ions in other portions than the upper portion of the side wall of the groove's opening.

In the next step, as shown in FIG. 4, $As^+$ ions are injected through oblique rotational injection to form an $n^+$ layer 9, a high dielectric layer 10 serving as an insulating film for the capacitor portion is formed after removing the photoresist 6, and an electrode 11 of polysilicon, etc. is formed thereon. After an insulating film 12 and a gate insulating film 13 are formed, a word line 14 will be patterned. An $n^+$ diffusion layer 15 is formed by injecting $As^+$ ions with a photoresist as a mask. Then, after an interlayer film 16 is grown on the resultant structure, a contact for the diffusion layer 15 will be patterned, and a digit line 17 will be formed of aluminum or the like, thus completing a semiconductor memory device.

According to the above-described conventional oblique rotational injection of $B^+$ ions in the side wall of the grooved capacitor portion, the $p^+$ layer 8 is formed while varying the oblique ion injecting angle $\theta$ within a range of 0 (vertical) to 55 degrees in FIG. 3 so that the boron concentration in the groove 7 may be uniform. As mentioned above, however, this method creates the $p^+$ layer-overlapped portion 21 where the $p^+$ layer 3 underlying the field oxidized film 4 overlaps with the $p^+$ layer 8 of the side wall of the groove's opening. More specifically, if boron ions are injected at $2 \times 10^{13}$ cm$^{-2}$ to form the $p^+$ layer 3 and at $2 \times 10^{13}$ cm$^{-2}$ to form the $p^+$ layer 8, $4 \times 10^{13}$ cm$^{-2}$ of boron ions will be injected in the $p^+$ layer-overlapped portion 21, locally increasing the boron concentration. The depression layer of the p-n junction therefore becomes thinner at that portion. When a voltage is applied to the grooved capacitor portion, therefore, more electric field concentrates locally in the depression layer at the $p^+$ layer-overlapped portion 21 where boron ions of $4 \times 10^{13}$ cm$^{-2}$ have been injected than in the other portion. This will significantly reduce the dielectric strength and increase the leak current. In addition, crystal defects which occur in the silicon substrate at the time of ion injection are apt to remain to further increase the leak current, thereby impairing the reliability of this device, disadvantageously.

SUMMARY OF THE INVENTION

It is therefore an object of the present invention to eliminate the above disadvantages and to provide a method for fabricating a highly reliable semiconductor device with a grooved capacitor portion, which does not allow for ion injection only into the upper side wall of a groove at the time $B^+$ ions are injected in the side wall of the groove to prevent a depression layer from becoming locally thinner.

To achieve this object, a method for fabricating a semiconductor device according to the present invention comprises the steps of forming a highly concentrated first layer of the same conductivity type as that of a semiconductor substrate on a desired portion with an oxidization-resistant first insulating film as a mask, and performing thermal oxidization to form a field oxidized film; removing the first insulating film; forming a second insulating film; forming an opening on the second insulating film at the portion which is in a close proximity to the field oxidized film; etching the semiconductor substrate to form a groove; performing oblique rotational ion injection into a portion other than an upper side wall of the groove with the second insulating film as a peak-shaped mask, forming only on a desired region a highly concentrated second layer of the same conductivity type as that of the semiconductor substrate; removing the second insulating film; forming a highly concentrated third layer of an opposite conductivity type to that of the semiconductor substrate at least on the entire side wall of the groove; and forming a high dielectric film and a conductive electrode in the groove.

According to this method, at the time of injecting B+ ions in the groove through oblique rotational injection, using a peak-shaped mask of the insulating film, formed when the opening is formed in the groove, the ions are not allowed to be injected in the upper side wall of the groove to locally eliminate that portion whose boron concentration becomes high, thereby preventing the depression layer of the p-n junction from becoming thinner while suppressing local concentration of an electric field as well as preventing crystal defects having occurred in the silicon substrate at the time of ion injection from locally remaining. A highly reliable semiconductor device having a grooved capacitor portion can therefore be provided.

DETAILED DESCRIPTION OF THE PREFERRED EMBODIMENTS

Figure 1:
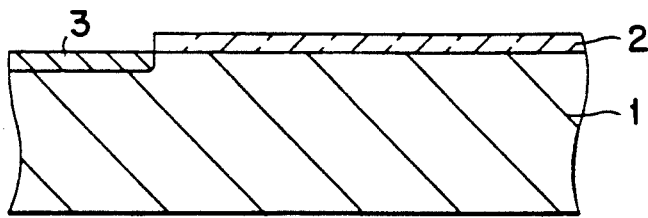
FIGS. 1 through 4 are longitudinal cross sections exemplifying a conventional semiconductor device.
Figure 2:
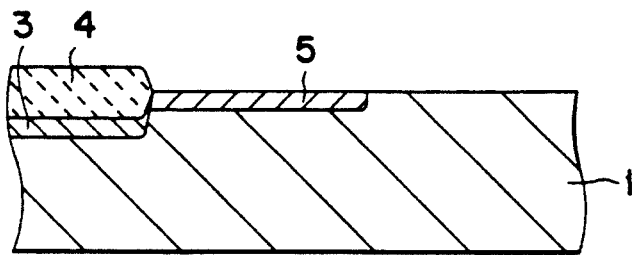
Figure 3:
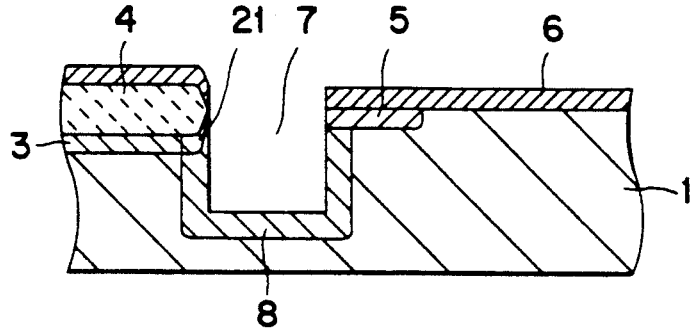
Figure 4:
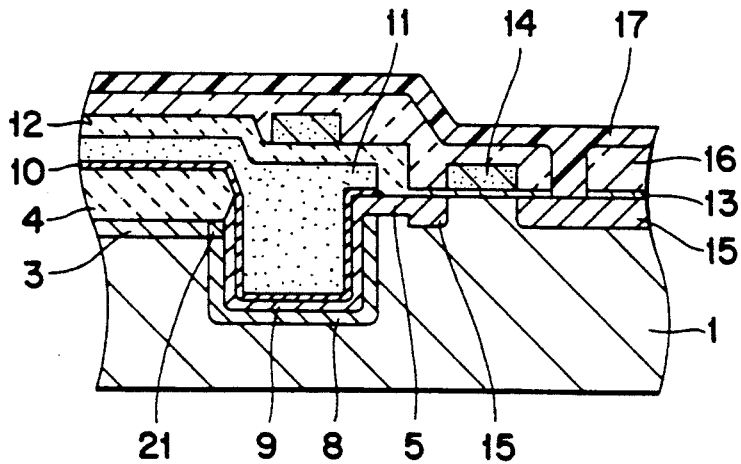
Figure 5:
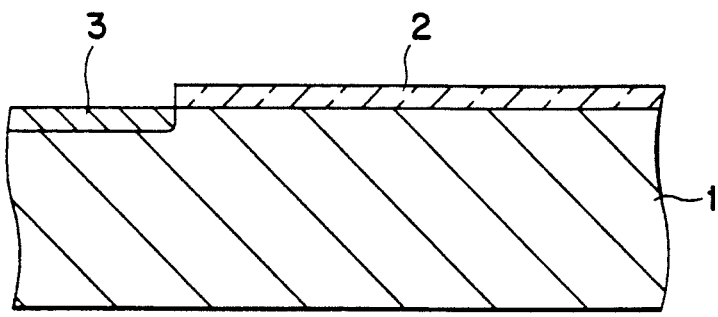
FIGS. 5 through 10 and FIG. 12 are longitudinal cross sections for explaining one embodiment of the present invention.
Figure 6:
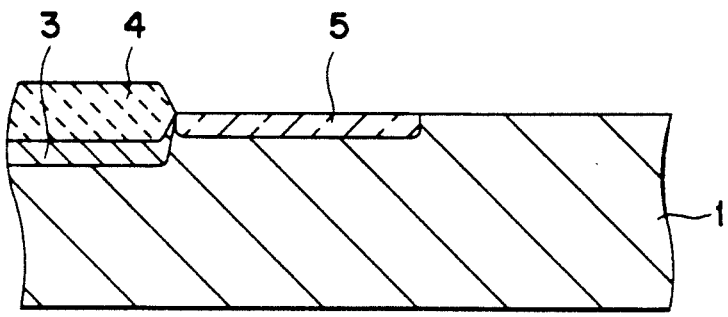
Figure 7:
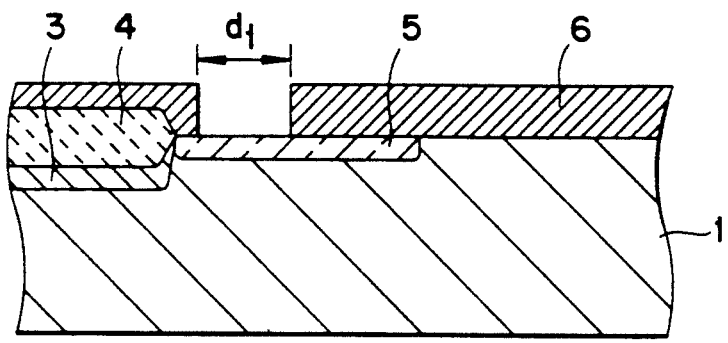
Figure 8:
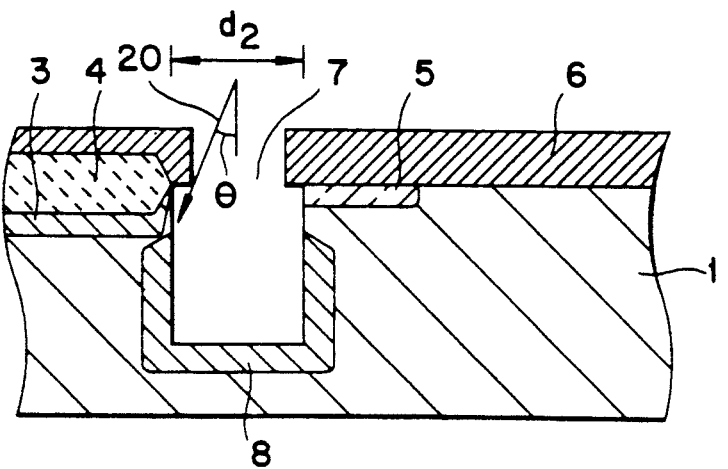
Figure 9:
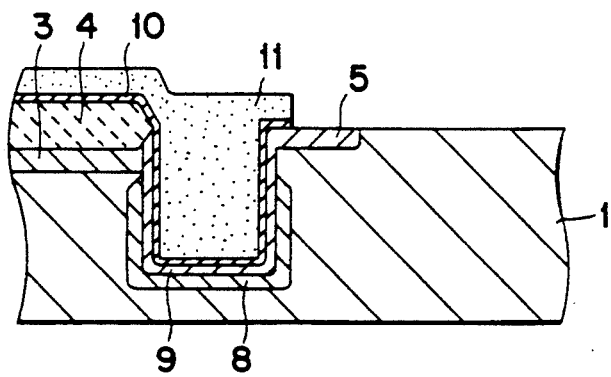
Figure 10:
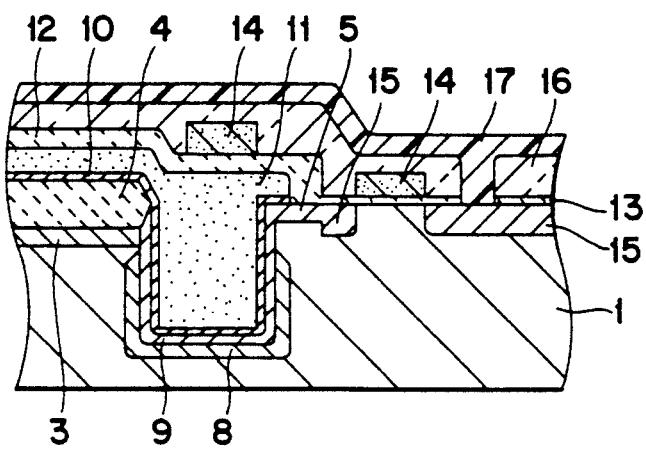

The present invention will now be described referring to the accompanying drawings. FIGS. 5 through 10 present longitudinal cross sections of one embodiment of this invention. In this embodiment, a semiconductor substrate 1 is a p-type silicon substrate. First, as shown in FIG. 5, after a nitrided film 2 is formed at a thickness of 1500 Å on the semiconductor substrate 1, a lithography step will be carried out to form an opening that reaches the semiconductor substrate 1, and then B+ ions of $2 \times 10^{13}$ cm$^{-2}$ are injected through the opening to the desired portion for a device isolating region to prevent a punch through between devices, thereby forming a p+ layer 3. Next, the semiconductor substrate 1 is oxidized using a LOCOS method to form a field oxidized film 4 of 7000 Å in thickness that will become the device isolating region and the nitrided film 2 is then eliminated, as shown in FIG. 6. Subsequently, As+ ions are injected into the desired portion through a lithography step to form an n+ layer 5 with a concentration of $10^{18}$ cm$^{-3}$ and a depth of 0.3 μm. Then a photoresist 6 is applied on the resultant structure, and a lithography step is performed to form an opening that reaches the n+ layer 5 in the desired portion, as shown in FIG. 7. At this time, the opening $d_1$ is made 1.0 μm wide, which is 0.4 μm narrower than the designed value (1.4 μm) of the opening diameter $d_2$ of the groove. As shown in FIG. 8, with a photoresist used as a mask, a groove 7 of 5 to 7 μm deep is formed in the opening portion of the n+ layer 5 by reactive ion etching (RIE). At this time, reaction gas used for the etching is continuously changed from the one having a slightly high isotropy to the one of high anisotropy. This forms a peak by the resist in the groove's opening portion, thereby making the groove 1.4 μm wide. Then B+ ions 20 are injected in the side wall of the groove 7 through oblique rotational injection to form a capacitor and reduce the soft error rate, thus forming a p+ layer 8 with a concentration of $10^{16}$ cm$^{-3}$ and a depth of 0.6 μm from the side wall. The oblique ion injecting angle θ at this time is set within a range of 0 (vertical) to 15 degrees so that boron ions will not be injected in the region approximately 0.8 μm deep from the substrate surface, thus preventing the p+ layer 3 from overlapping with the p+ layer 8. In the next step, as shown in FIG. 9, the photoresist 6 is removed, and As+ ions are injected through a lithography step again to form an n+ layer 9 with a concentration of $10^{18}$ cm$^{-3}$ and a depth of 0.2 μm from the side wall. Then, a high dielectric layer 10 serving as an insulating film for the capacitor portion is formed, and phosphorus doping is repeated for growing polysilicon. The resultant structure is etched back to embed polysilicon in the groove 7, and is then patterned to form a polysilicon electrode 11. Then, after an insulating film 12 is formed at a thickness of approximately 2000 Å followed by formation of a 300 Å-gate insulating film 13, a polysilicon word line 14 will be patterned. An n+ diffusion layer 15 is formed at a depth of approximately 0.3 μm with a concentration of $10^{19}$ cm$^{-3}$ by patterning the photoresist and injecting As+ ions with the photoresist as a mask. After an interlayer film 16 is grown at a thickness of 500 Å on the resultant structure, a contact for the diffusion layer 15 will be patterned, and a digit line 17 will be formed of aluminum or the like, thus forming a cell of MOS type DRAM having a grooved capacitor portion.

Figure 12:
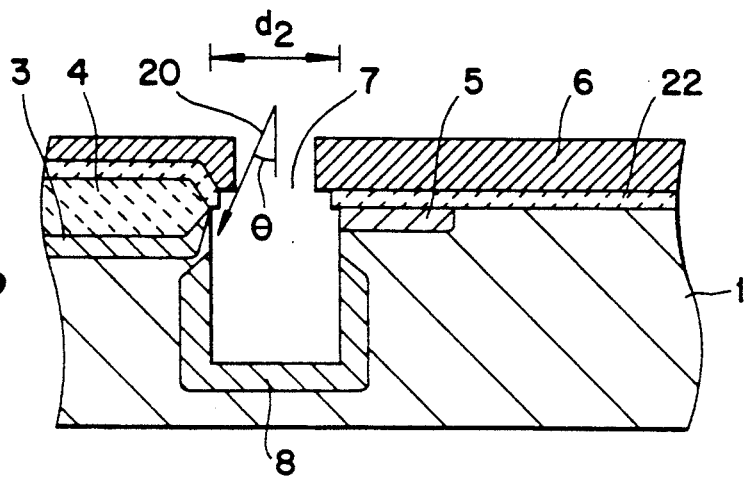

Although this embodiment employs a photoresist film as a mask in forming the opening of the groove 7 and injecting B+ ions, this mask is not restricted to this type. For instance, an insulating film such as an oxidized silicon film or a nitrided silicon film may also be used. Alternatively, a multi-layered film as shown in FIG. 12 may be used as well. FIG. 12 shows a modification which employs a double-layered structure consisting of an oxidized silicon film 22 and a photoresist 6. In this case, the oxidized silicon film 22 is used to serve as a mask at the time of opening the groove as well as to protect the surface of the semiconductor substrate 1, and the photoresist 6 is applied on this oxidized silicon film 22. Through a lithography step, an opening that reaches the oxidized silicon film is formed in the desired portion. Next, the oxidized silicon film is isotropically etched back from the resist, thereby forming a peak by the resist in the opening portion. Then the groove 7 is formed 5 to 7 μm deep by reactive ion etching as done in the previous embodiment. In this case the distance from the substrate surface to the p+ layer 8 can be determined by controlling the amount of side etching of the oxidized silicon film 22. The subsequent steps are the same as those of the previous embodiment.

Figure 11:
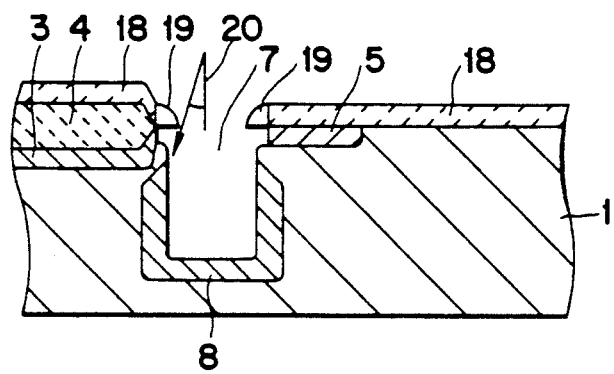
FIG. 11 is a longitudinal cross section for explaining a second embodiment of the present invention.

FIG. 11 illustrates a longitudinal cross section of a second embodiment of the present invention.

In the second embodiment the photoresist 6 in FIG. 7 is replaced with a nitrided film 18 which is deposited by a CVD method, and an opening which reaches the n+ layer 5 is formed 1.4 μm wide in the desired portion through a lithography step. Then, an oxidized film is deposited on the nitrided film 18 by a CVD method, and is etched back to form a side wall 19 on the opening on the side wall lying on the nitrided film. With the nitrided film 18 and side wall 19 used as masks, the opening portion of the n+ layer 5 is subjected to wet etching until the groove width becomes 1.4 μm, thereby forming a peak by the side wall. Then, using gas with slightly high anisotropy, a groove is formed 5 to 7 μm deep by an RIE method. Then B+ ions 20 are injected in the side wall of the groove 7 through oblique rotational injection as done in the first embodiment, forming the p+ layer 8. The other steps are the same as those of the first embodiment. As the edge of the groove 7 is tapered according to the second embodiment, the sharp angle of the edge of the groove opening portion can be rounded, and the high dielectric layer is removed at the portion which locally becomes thinner, thus ensuring approximately uniform film thickness. This feature can provide a grooved capacitor portion with a higher reliability.

What is claimed is:

1. A method for fabricating a semiconductor device, adapted for a MOS type DRAM having a grooved cell capacitor portion formed in a main surface of a semiconductor substrate, comprising the steps of:

forming a first layer of the same conductivity type as that of the semiconductor substrate on a selected portion of the semiconductor substrate with an oxidization-resistant first insulating film as a mask, and performing thermal oxidation to form a field oxidized film;

removing the first insulating film;

forming a second insulating film on an entire surface of the semiconductor substrate;

forming an opening in the second insulating film at the portion which is in a close proximity to the field oxidized film;

etching the semiconductor substrate to form a groove;

performing oblique rotational ion injection into a portion of the groove other than a side wall portion of the groove adjacent the first layer with the second insulating film as a peak-shaped mask, forming only in a selected region inside the groove a second layer of the same conductivity type as that of the semiconductor substrate;

removing the second insulating film;

forming a third layer of an opposite conductivity type to that of the semiconductor substrate at least on the entire side wall of the groove; and forming a dielectric film and a conductive electrode in the groove.

2. A method according to claim 1, wherein a photoresist film is used as the second insulating film.

3. A method according to claim 1, wherein an oxidized silicon film is used as the second insulating film.

4. A method according to claim 1, wherein a nitrided silicon film is used as the second insulating film.

5. A method according to claim 1, wherein a multi-layered film consisting of a combination of an oxidized silicon film and a photoresist film is used as the second insulating film.

6. A method according to claim 1, wherein a multi-layered film consisting of a combination of a nitrided silicon film and a photoresist film is used as the second insulating film.

7. A method according to claim 1, wherein a multi-layered film consisting of a combination of an oxidized silicon film, a nitrided silicon film and a photoresist film is used as the second insulating film.

8. A method for fabricating a semiconductor device, adapted for a MOS type DRAM having a grooved cell capacitor portion formed in a main surface of a semiconductor substrate, comprising the steps of:

forming a first layer of the same conductivity type as that of the semiconductor substrate on a selected portion of the semiconductor substrate with an oxidization-resistant first insulating film as a first mask, and performing thermal oxidation to form a field oxidized film;

removing the first insulating film;

forming a second mask on an entire surface of the semiconductor substrate;

forming an opening in the second mask at the portion which is in a close proximity to the field oxidized film;

etching the semiconductor substrate to form a groove;

performing oblique rotational ion injection into a portion of the groove other than a side wall portion of the groove adjacent the first layer with the second mask as a peak-shaped mask, forming only in a selected region inside the groove a second layer of the same conductivity type as that of the semiconductor substrate;

removing the second mask;

forming a third layer of an opposite conductivity type to that of the semiconductor substrate at least on the entire side wall of the groove; and forming a dielectric film and a conductive electrode in the groove.

9. A method according to claim 8, wherein a photoresist film is used as the second mask.

10. A method according to claim 8, wherein an oxidized silicon film is used as the second mask.

11. A method according to claim 8, wherein a nitrided silicon film is used as the second mask.

12. A method according to claim 8, wherein a multi-layered film consisting of a combination of an oxidized silicon film and a photoresist film is used as the second mask.

13. A method according to claim 8, wherein a multi-layered film consisting of a combination of a nitrided silicon film and a photoresist film is used as the second mask.

14. A method according to claim 8, wherein a multi-layered film consisting of a combination of an oxidized silicon film, a nitrided silicon film and a photoresist film is used as the second mask.

15. A method for fabricating a semiconductor device, adapted for a MOS type DRAM having a grooved cell capacitor portion formed in a main surface of a semiconductor substrate, comprising the steps of:

forming a first layer of the same conductivity type as that of the semiconductor substrate on a selected portion of the semiconductor substrate with an oxidization-resistant first insulating film as a mask, and performing thermal oxidation to form a field oxidized film;

removing the first insulating film;

forming on an entire surface of the semiconductor substrate a second film durable against groove etching and functioning as a mask against ion injection;

forming an opening in the second film at the portion which is in a close proximity to the field oxidized film;

etching the semiconductor substrate to form a groove;

performing oblique rotational ion injection into a portion of the groove other than a side wall portion of the groove adjacent the first layer with the second film as a peak-shaped mask, forming only in a selected region inside the groove a second layer of the same conductivity type as that of the semiconductor substrate;

removing the second film;

forming a third layer of an opposite conductivity type to that of the semiconductor substrate at least on the entire side wall of the groove; and forming a dielectric film and a conductive electrode in the groove.

16. A method according to claim 15, wherein a photoresist film is used as the second film.

17. A method according to claim 15, wherein an oxidized silicon film is used as the second film.

18. A method according to claim 15, wherein a nitrided silicon film is used as the second film.

19. A method according to claim 15, wherein a multilayered film consisting of a combination of an oxidized silicon film and a photoresist film is used as the second film.

20. A method according to claim 15, wherein a multilayered film consisting of a combination of a nitrided silicon film and a photoresist film is used as the second film.

21. A method according to claim 15, wherein a multilayered film consisting of a combination of an oxidized silicon film, a nitrided silicon film and a photoresist film is used as the second film.

* * * * *